United States Patent
Le et al.

(10) Patent No.: US 11,450,527 B2
(45) Date of Patent: Sep. 20, 2022

(54) ENGINEERING TENSILE STRAIN BUFFER IN ART FOR HIGH QUALITY GE CHANNEL

(71) Applicant: Intel Corporation, Santa Clara, CA (US)

(72) Inventors: Van H. Le, Portland, OR (US); Benjamin Chu-Kung, Portland, OR (US); Willy Rachmady, Beaverton, OR (US); Marc C. French, Forest Grove, OR (US); Seung Hoon Sung, Portland, OR (US); Jack T. Kavalieros, Portland, OR (US); Matthew V. Metz, Portland, OR (US); Ashish Agrawal, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/303,125

(22) PCT Filed: Jul. 2, 2016

(86) PCT No.: PCT/US2016/040909
§ 371 (c)(1),
(2) Date: Nov. 19, 2018

(87) PCT Pub. No.: WO2018/009169
PCT Pub. Date: Jan. 11, 2018

(65) Prior Publication Data
US 2020/0066515 A1    Feb. 27, 2020

(51) Int. Cl.
*H01L 29/10*    (2006.01)
*H01L 21/02*    (2006.01)
(Continued)

(52) U.S. Cl.
CPC .. *H01L 21/02532* (2013.01); *H01L 21/02381* (2013.01); *H01L 29/1054* (2013.01);
(Continued)

(58) Field of Classification Search
CPC ......... H01L 21/02532; H01L 21/02381; H01L 29/1054; H01L 29/6681; H01L 29/66818; H01L 29/785
See application file for complete search history.

(56) References Cited

U.S. PATENT DOCUMENTS 9,564,494 B1 *  2/2017  Cheng ............... H01L 21/02389
10,068,963 B2 *  9/2018  Chiang ............... H01L 29/1054
(Continued)

FOREIGN PATENT DOCUMENTS

WO    WO-2015099784    7/2015

OTHER PUBLICATIONS

International Search Report and Written Opinion for International Patent Application No. PCT/US2016/040909 dated Apr. 26, 2017, 13 pgs.
(Continued)

*Primary Examiner* — Sarah K Salerno
(74) *Attorney, Agent, or Firm* — Schwabe, Williamson & Wyatt, P.C.

(57) ABSTRACT

An apparatus including a transistor device including a channel including germanium disposed on a substrate; a buffer layer disposed on the substrate between the channel and the substrate, wherein the buffer layer includes silicon germanium; and a seed layer disposed on the substrate between the buffer layer and the substrate, wherein the seed layer includes germanium. A method including forming seed layer on a silicon substrate, wherein the seed layer includes germanium; forming a buffer layer on the seed layer, wherein the buffer layer includes silicon germanium; and
(Continued)

forming a transistor device including a channel on the buffer layer.

15 Claims, 11 Drawing Sheets

(51) Int. Cl.
*H01L 29/66* (2006.01)
*H01L 29/78* (2006.01)

(52) U.S. Cl.
CPC .... *H01L 29/6681* (2013.01); *H01L 29/66818* (2013.01); *H01L 29/785* (2013.01)

(56) References Cited

U.S. PATENT DOCUMENTS

| | | | |
|---|---|---|---|
| 2008/0237572 | A1 | 10/2008 | Chui et al. |
| 2015/0206796 | A1* | 7/2015 | Dasgupta .......... H01L 21/76229 257/76 |
| 2016/0027779 | A1 | 1/2016 | Loo et al. |
| 2016/0027780 | A1* | 1/2016 | Mitard ............. H01L 29/66795 257/190 |
| 2016/0027876 | A1 | 1/2016 | Lee et al. |
| 2016/0126109 | A1* | 5/2016 | Sun .................. H01L 29/161 257/622 |
| 2016/0190304 | A1 | 6/2016 | Morin et al. |
| 2017/0229543 | A1* | 8/2017 | Glass .................. H01L 29/1054 |
| 2017/0323962 | A1* | 11/2017 | Dewey ............. H01L 29/66795 |
| 2017/0358645 | A1* | 12/2017 | Dewey ............. H01L 21/02603 |
| 2018/0158944 | A1* | 6/2018 | Mohapatra ............ H01L 29/785 |

OTHER PUBLICATIONS

International Preliminary Report on Patentability for International Patent Application No. PCT/US2016/040909, dated Jan. 17, 2019, 10 pages.

* cited by examiner

ENGINEERING TENSILE STRAIN BUFFER IN ART FOR HIGH QUALITY GE CHANNEL

CROSS-REFERENCE TO RELATED APPLICATION

This patent application is a U.S. National Phase Application under 35 U.S.C. § 371 of International Application No. PCT/US2016/040909, filed Jul. 2, 2016, entitled "ENGINEERING TENSILE STRAIN BUFFER IN ART FOR HIGH QUALITY GE CHANNEL," which designates the United States of America, the entire disclosure of which is hereby incorporated by reference in its entirety and for all purposes.

BACKGROUND

Field

Integrated circuit devices.

Description of Related Art

Relaxed germanium channels having very low defect density are needed for high intrinsic carrier mobility, Germanium has a 4.2 percent lattice mismatch with silicon and direct epitaxial growth of a non-planar structure (e.g., a fin) of germanium on silicon results in defect formation and degraded performance.

DETAILED DESCRIPTION

Techniques to improve performance in transistor devices including a germanium channel are described. In one embodiment, device performance is improved through the use of a buffer layer including tensile-strained silicon germanium (SiGe) on silicon that has a similar lattice constant as germanium. The tensile-strained silicon germanium buffer layer will tend to reduce defects in the buffer layer due to lattice mismatch. A semiconductor material of germanium formed (e.g., epitaxially grown) on a relatively defect-free buffer layer will similarly see reduced defects since a lattice constant is the same as that of the buffer layer resulting in improved material quality, transport and performance when integrated as a transistor device channel. Additionally, since silicon germanium has a valence band offset with germanium, the valence band offset will result in efficient carrier (e.g., hole) confinement in the germanium channel and improve short channel effects for germanium devices.

Figures 1, 2:
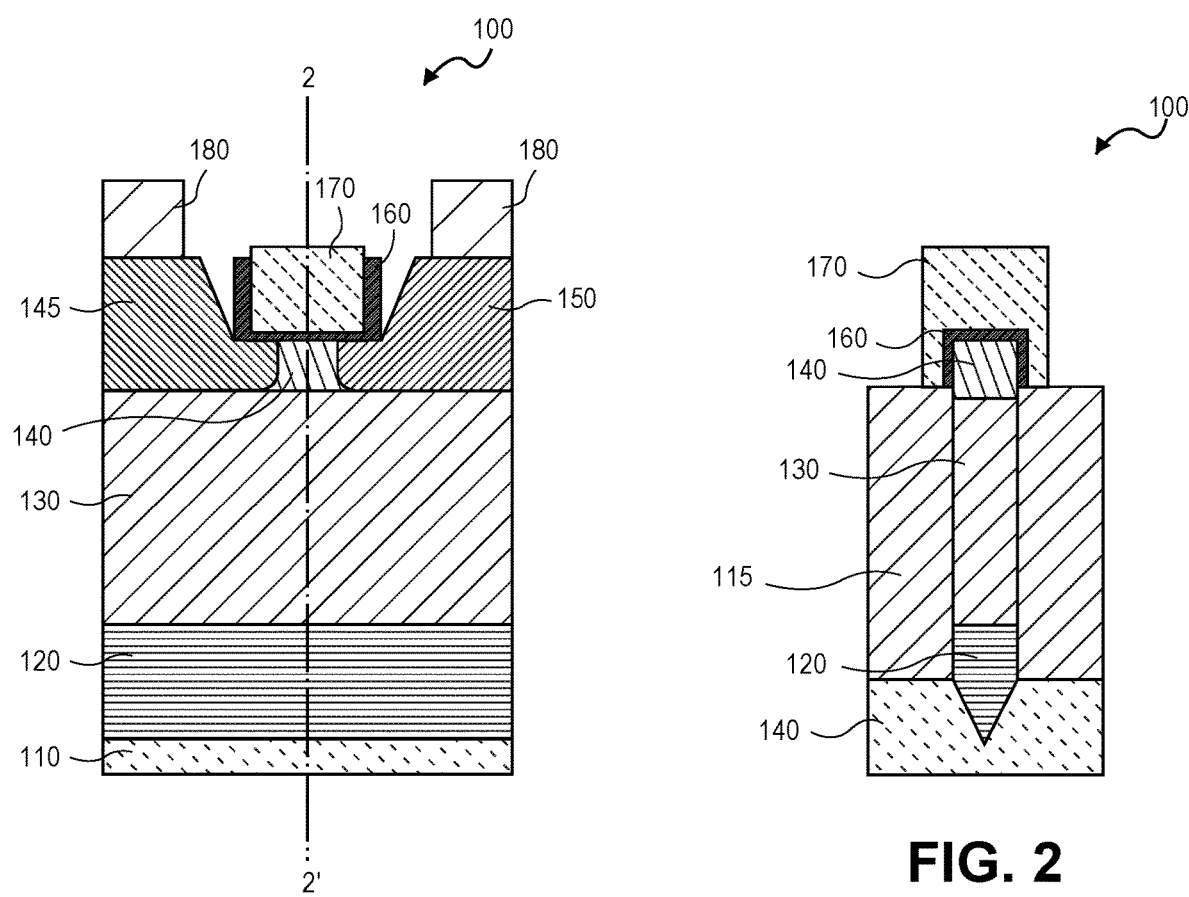
FIG. 1 shows a cross-sectional side view of a portion of a field effect transistor (FET) device.
FIG. 2 shows the structure of FIG. 1 through line 2-2'.

FIG. 1 shows a cross-sectional side view of an embodiment of a field effect transistor (FET) device. FIG. 2 shows the structure of FIG. 1 through line 2-2'. Referring to FIG. 1 and FIG. 2, device 100 includes substrate 110 that is, for example, a single crystal silicon substrate. Disposed on substrate 110, in this embodiment, is seed layer 120. Seed layer 120 includes, for example, a material that has a larger lattice than a material of the substrate (e.g., silicon substrate 110). One suitable material for seed layer 120 is germanium. Where substrate 110 is single crystal silicon, germanium has a larger lattice constant than silicon. The larger lattice constant of the germanium relative to silicon presents a lattice mismatch that results in crystalline defects. In the case of germanium which is a high performance channel material candidate, the lattice mismatch is extremely high (about four percent) with a substrate material of silicon. Epitaxially grown germanium on silicon will initially tend to adopt the smaller lattice constant of the silicon. Continued growth of germanium will tend to relax the germanium to a point, referred to as a critical thickness, where germanium will adopt its natural lattice constant. In one embodiment, seed layer 120 of germanium has a thickness equal to a critical thickness or greater than a critical thickness. A representative thickness of seed layer 120 of germanium that is equal to a critical thickness or greater is 5 nanometers (nm) or greater.

In the embodiment in FIG. 1 and FIG. 2, disposed on seed layer 120 is buffer layer 130. In one embodiment, buffer layer 130 is a material that confines all the defects due to lattice mismatch between a material of seed layer 120 (e.g., germanium) and a material of substrate 110 (e.g., silicon), and results in a defect-free interface to serve as a template of germanium growth. A suitable material is also one that does not alter the high mobility and desired characteristics of a channel material. For a channel material of germanium, one suitable material for buffer layer 130 is tensile-strained silicon germanium. Tensile-strained silicon germanium is a material that has a lattice constant less than a lattice constant of germanium and is present in an amount or thickness that is less than a critical thickness where the silicon germanium might relax and adopt its natural lattice constant.

As illustrated in FIG. 1, disposed on buffer layer 130 is junction region 145 and junction region 150. In one embodiment, junction region 145 is a source of a FET (e.g., an p+ source) and junction region 150 is a drain (e.g., p+ drain). Disposed between junction regions 145 and 150 is channel 140 of an intrinsic semiconductor material such as germanium. In one embodiment, the channel material (e.g., germanium) will have a similar lattice constant as a material of buffer layer 130 (e.g., tensile-strained silicon germanium). In one embodiment, buffer layer 130 has a defect-free surface at an interface with channel 140. Overlying channel 140 is gate dielectric layer 160 of, for example, a silicon dioxide or a dielectric material having a dielectric constant greater than silicon dioxide (a high k material). Disposed on gate dielectric 160 is gate electrode 170 of, for example, a metal material (e.g., tungsten, tantalum). FIG. 1 also shows metal contact 180 to junction region 145 and metal contact 185 to junction region 150.

Figure 3:
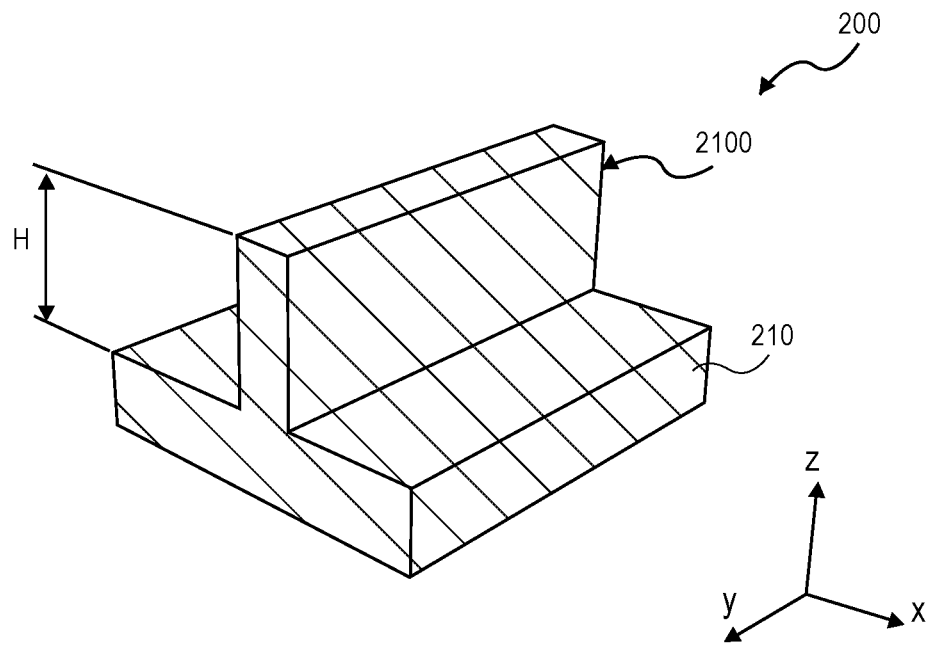
FIG. 3 shows a perspective side view of a substrate that may be any material that may serve as a foundation on which a multi-gate FET may be constructed, the substrate having a sacrificial fin formed therein.

FIGS. 3-13 describe a process for forming an FET such as illustrated in FIGS. 1 and 2. FIG. 14 presents a flow chart of the process. FIGS. 3-13 describe a three-dimensional multi-gate FET including a germanium channel on a tensile-strained silicon-germanium buffer layer. The implementation of a germanium channel on a tensile-strained silicon germanium buffer layer can similarly be applied to planar transistors and gate all around transistors. Referring to FIG. 3 and with reference to the flow chart of FIG. 14, process 300 begins by defining sacrificial fin structures in a substrate material of structure 200 (block 310, FIG. 14). FIG. 3 shows a perspective side view of substrate 210 that may be any material that may serve as a foundation of which a multi-gate FET may be constructed. Representatively, substrate 210 is a portion of a larger substrate such as wafer. In one embodiment, substrate 210 is a semiconductor material such as single crystal silicon. Substrate 210 may be a bulk substrate or, in another embodiment, a semiconductor on insulator (SOI) structure. FIG. 3 shows substrate 210 following a patterning of the substrate to define sacrificial fin 2100. Sacrificial fin 2100 may be one of many sacrificial fins formed in the substrate. Sacrificial fin 2100 may be formed by a mask and etch process wherein a mask (e.g., a hard mask) is introduced on a surface (superior surface) of substrate 210 to protect areas of the substrate where the sacrificial fins will be defined and to provide openings in non-fin areas. Once the mask is patterned, substrate 210 may be etched to remove material in unprotected areas. A substrate of silicon may be etched with a wet or dry etch. Representatively, a suitable etchant is HF based chemistry. In one embodiment, sacrificial fin 2100 is etched to have a height, H, on the order of 100 nanometers (nm) to 400 nm.

Figure 4:
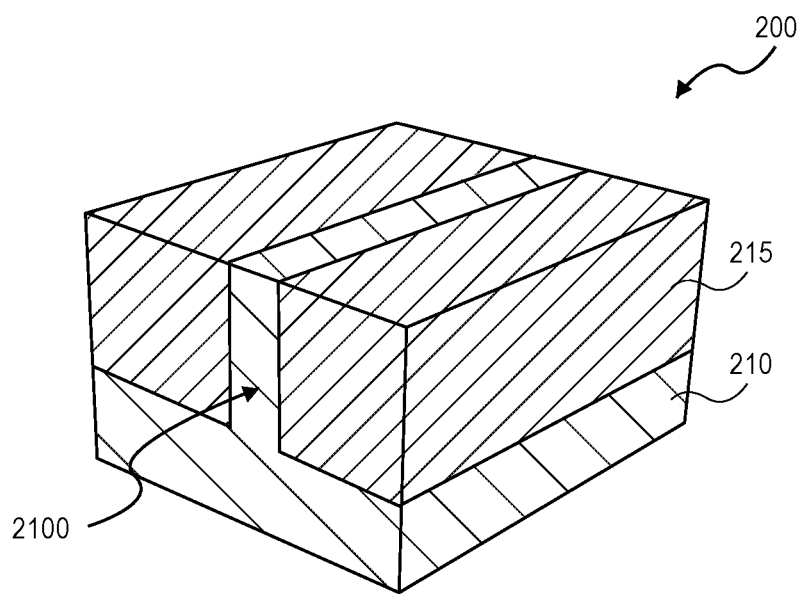
FIG. 4 shows the structure of FIG. 3 following a deposition of a trench dielectric layer on the substrate and planarized to a surface of the sacrificial fin.

FIG. 4 shows the structure of FIG. 3 following a removal of the mask on the fin and following the deposition of a trench dielectric layer on the substrate (block 315, FIG. 14). In one embodiment, dielectric layer 215 is silicon dioxide or a low-k dielectric material. Following deposition of dielectric layer 215, a surface of the structure (a superior surface as viewed) is polished to the level of the top of sacrificial fin 2100 so that the fin is exposed.

Figure 5:
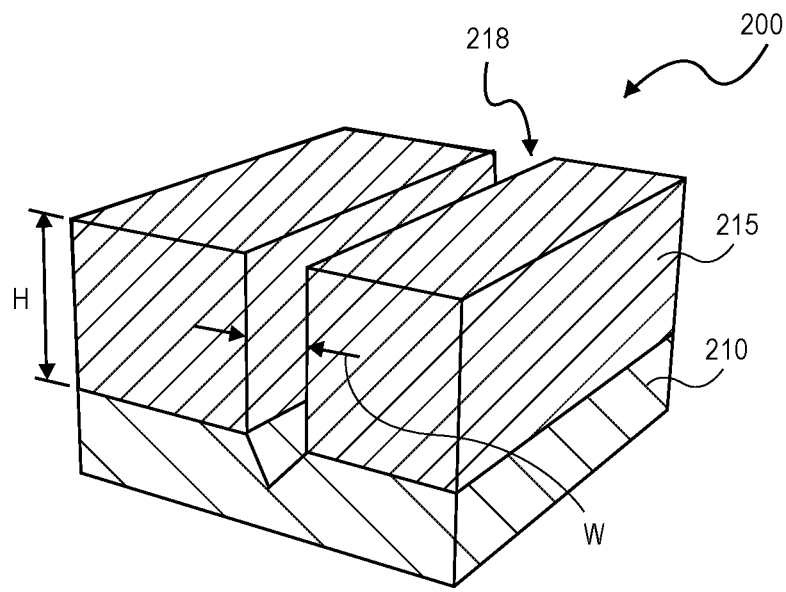
FIG. 5 shows the structure of FIG. 4 following the removal of the sacrificial fin to form a trench of a controlled size and shape.

FIG. 5 shows the structure of FIG. 4 following the removal of sacrificial fin 2100 to form a trench of a controlled size and shape (block 320, FIG. 14). The sacrificial fin may be removed by a mask and etch process wherein a mask is patterned on a surface of dielectric layer 215 leaving sacrificial fin 2100 exposed followed by an etch process to remove the fin. Sacrificial fins of a silicon material may be etched by a dry or wet etch or a combination of the two. Suitable etchants for etching sacrificial fins of a silicon material include potassium hydroxide (KOH) and tetramethylammonium hydroxide (TMAH). The removal of the sacrificial fin forms trench 218. In one embodiment, the etching of the sacrificial fin may be performed to provide a {111} faceting at the bottom of trench 218 which is done using TMAH-like or any equivalent chemistry to facilitate a subsequent growth of material(s) in the trench. Alternative geometries are also contemplated. The trench confined growth of materials offer an advantage of aspect ratio trapping (ART) whereby crystalline quality of the epitaxial layer is enhanced through trapping of threading dislocations, stacking faults, twins, etc., at sidewalls of trench 218 where defects terminate such that overlying layers may be increasingly defect-free. In one embodiment, to achieve ART, trench 218 has dimensions such that its height, h, is on the order of twice its width, w.

Figure 6:
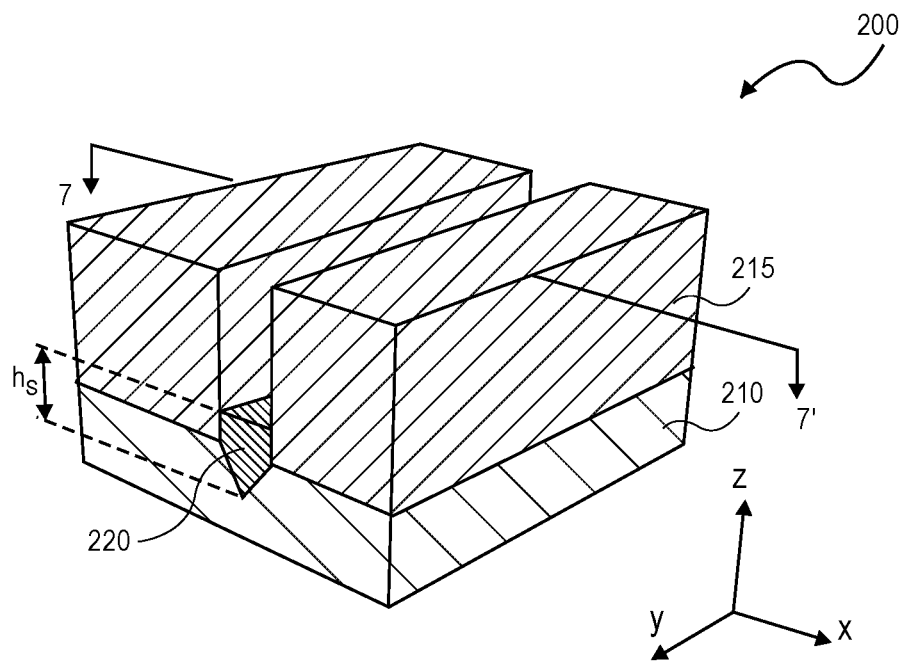
FIG. 6 shows the structure of FIG. 5 following the introduction of a seed layer in the trench.

FIG. 6 shows the structure of FIG. 5 following the introduction of a seed layer in trench 218 (block 322, FIG. 14). In one embodiment, seed layer 220 is a germanium (Ge). The seed layer may be introduced by an epitaxial growth process. Where substrate 210 is a single crystal silicon material and seed layer 220 is germanium, the epitaxial growth of seed layer 220 is trench 218 will result in crystalline defects due to a lattice mismatch of the material. Upon its initial introduction, seed layer 220 of germanium will be forced to adopt the smaller lattice constant of the silicon substrate. Continued introduction (e.g., growth) of germanium in trench 318 will allow the germanium to relax when a strain energy is too large to maintain a local equilibrium with silicon. Such a point or thickness is referred to as a critical thickness where germanium will return to its natural lattice constant. In one embodiment, seed layer 320 is introduced to a thickness or height, $h_s$, of a critical thickness or beyond a critical thickness. A representative height, h, is on the order of 5 nm or greater.

Figure 7:
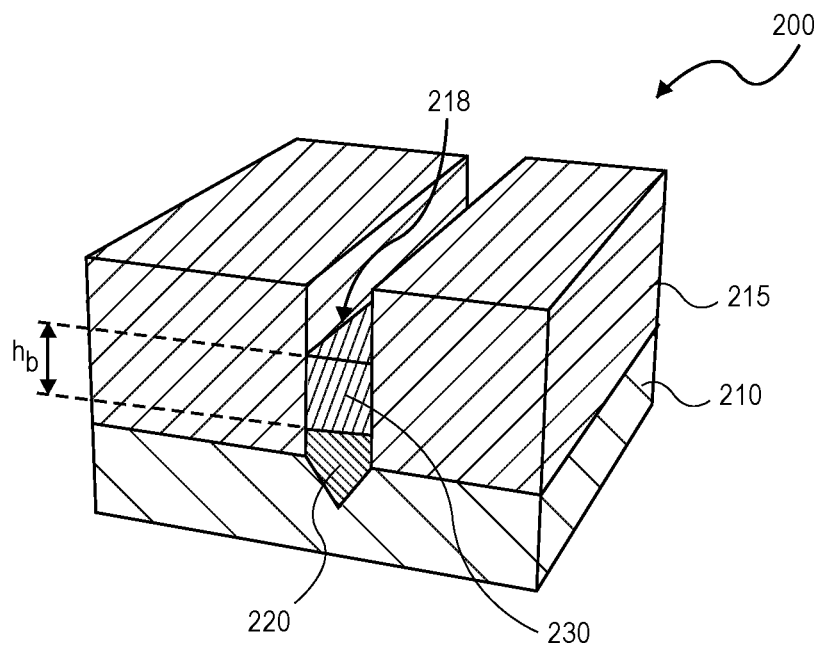
FIG. 7 shows the structure of FIG. 6 following the introduction of a buffer layer in the trench.

FIG. 7 shows buffer layer 230 formed on seed layer 220 (block 326, FIG. 14). In one embodiment, buffer layer 230 may be epitaxially grown. In one embodiment, buffer layer 230 is a silicon germanium material. Representatively, buffer layer 230 of silicon germanium includes 5 percent to 99 percent silicon (e.g., 10 percent silicon, 20 percent silicon, 30 percent silicon, 40 percent silicon, 50 percent silicon, 60 percent, 70 percent, 80 percent, 90 percent silicon) and is introduced (e.g., grown) to a thickness to be fully tensile-strained. A lattice constant of a material of buffer layer 230 in its natural or relaxed state, in one embodiment, is less than a lattice constant of seed layer 220 and formed on seed layer 220 to a thickness that is less than its critical thickness. Because a thickness of buffer layer 230 is less than its critical thickness, the lattice constant difference between a material of buffer layer 230 (e.g., silicon germanium) and seed layer 220 (e.g., germanium) will impart tensile strain on the material of buffer layer 230 as it adopts a lattice constant similar to the material of seed layer 220. Buffer layer 230 has a representative height, $h_b$, on the order of 40 nm to 400 nm (e.g., 100 nm to 300 nm). In one embodiment, buffer layer 230 has a defect-free surface that will interface with a channel material (a top surface as viewed).

Figure 8:
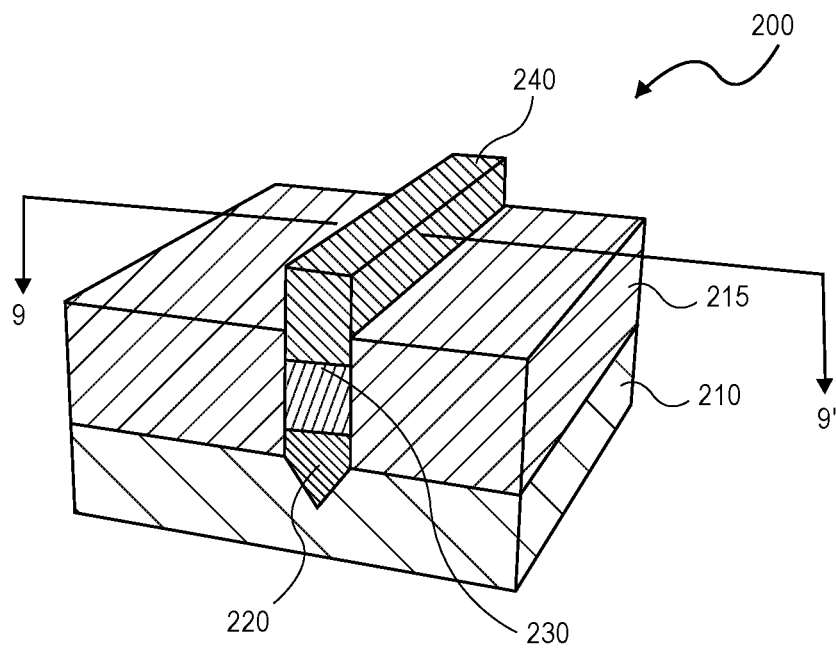
FIG. 8 shows the structure of FIG. 6 following a removal of a portion of the buffer material in the trench and the introduction of an intrinsic material into the trench.
Figure 9:
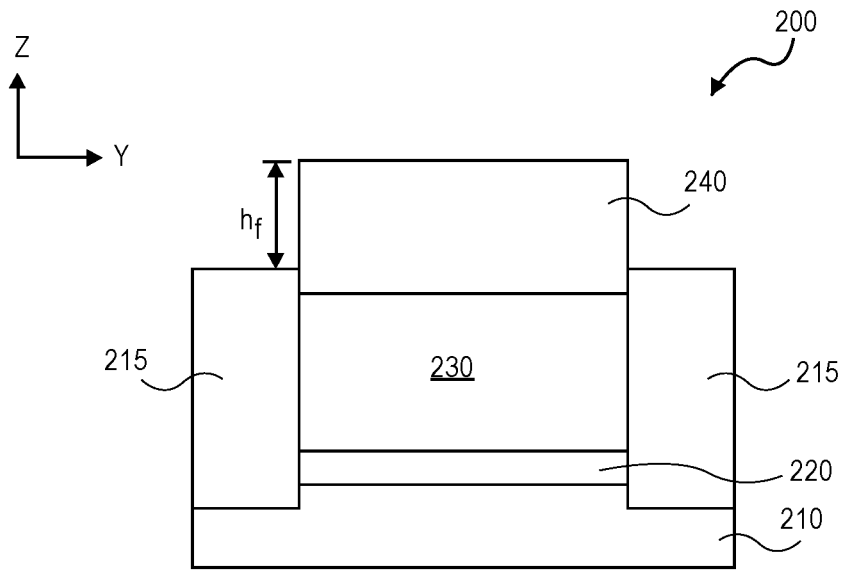
FIG. 9 shows a cross-sectional schematic side view of the structure of FIG. 8 through line 9-9'.
Figure 13:
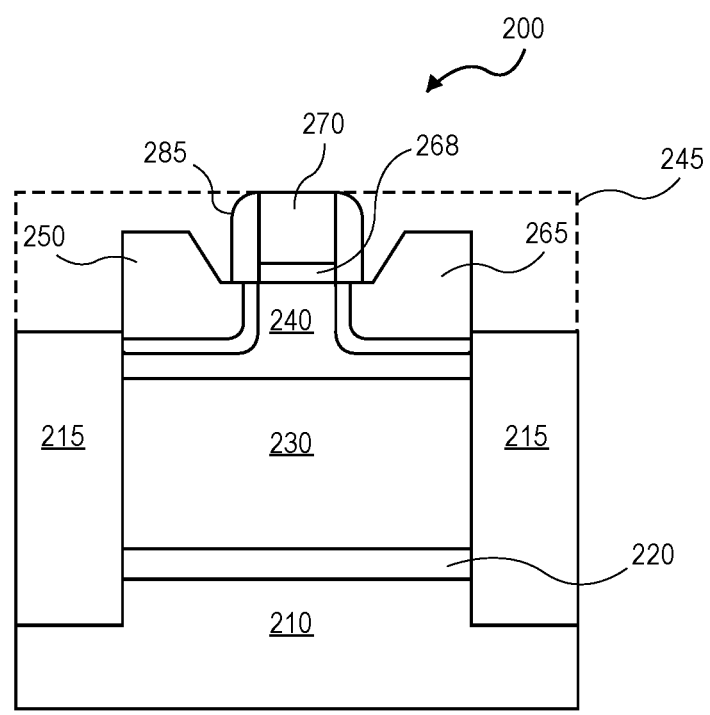
FIG. 13 shows the structure of FIG. 12 following the formation of a dopant diffusion barrier layer in each of the junctions designated for a source and a drain and following the formation of a source and a drain.
Figure 14:
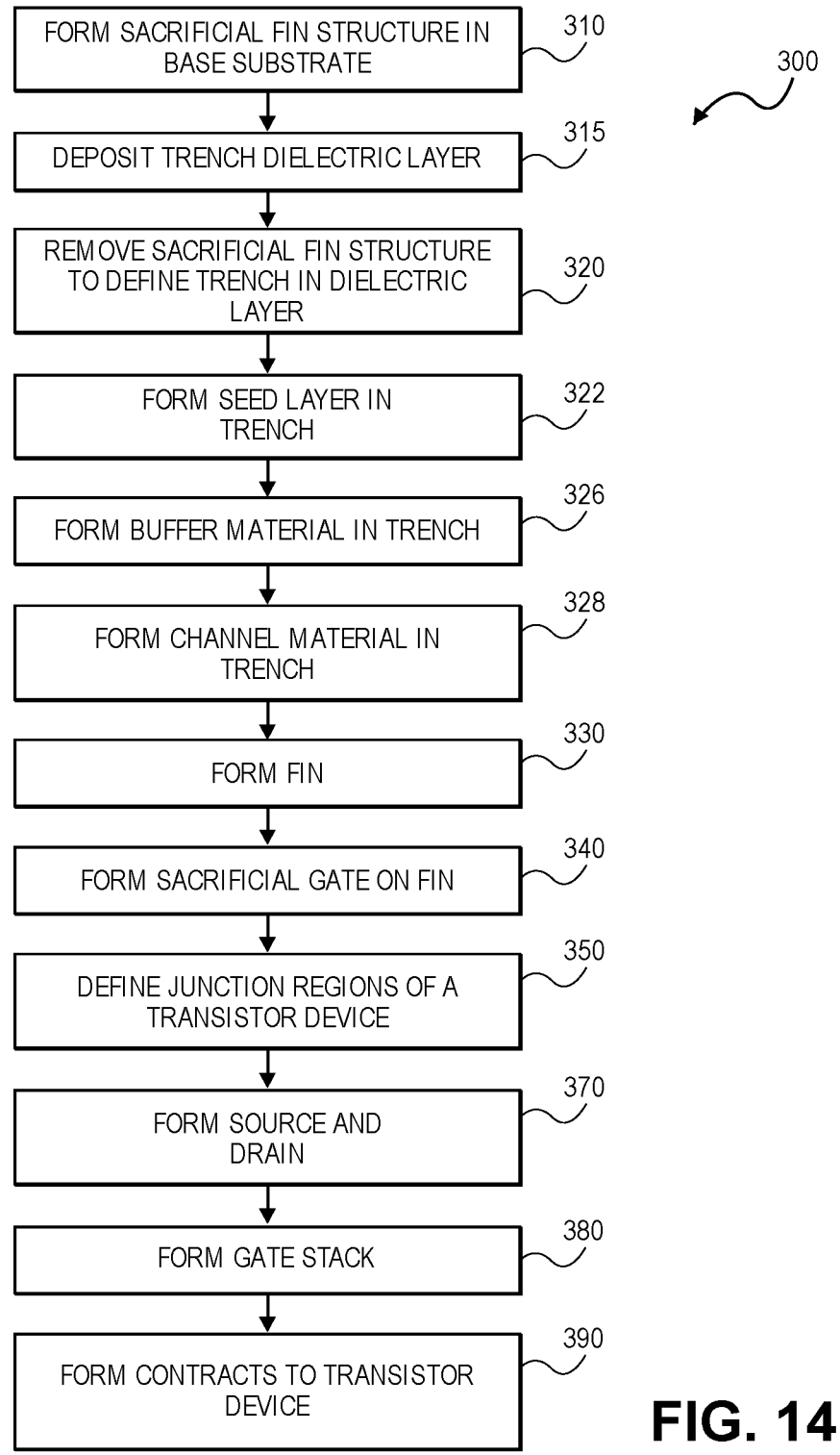
FIG. 14 presents a flow chart of an embodiment of a process of forming a three-dimensional transistor device with a multilayer or composite source and drain.

FIG. 8 shows the structure of FIG. 7 following an introduction of a semiconductor material into trench 218 (block 328, FIG. 13). In one embodiment, semiconductor material 240 is germanium. Semiconductor material 240, in one embodiment, will have a similar lattice constant as a lattice constant of a material of buffer layer 230. Where buffer layer 230 is silicon germanium tensile strained to a lattice constant of underlying seed layer 220 of germanium, semiconductor material 240 of germanium will be relaxed and have its natural lattice constant. FIG. 8 shows the structure following an epitaxial growth of semiconductor material 240 in trench 218; a polish of semiconductor material 240 to a plane defined by dielectric layer 215; and a subsequent recession of dielectric layer 215 such that the semiconductor material 240 is protruding above a plane defined by dielectric layer 215 as a fin structure (block 330, FIG. 14). In one embodiment, semiconductor material 240 has a representative height on the order of 40 nm to 100 nm. FIG. 9 shows a cross-sectional side view of the structure of FIG. 8 through line 9-9'. A representative height, $h_{fi}$ of the exposed fin is representatively on the order of 500 angstroms (Å) (50 nanometers).

Figure 10:
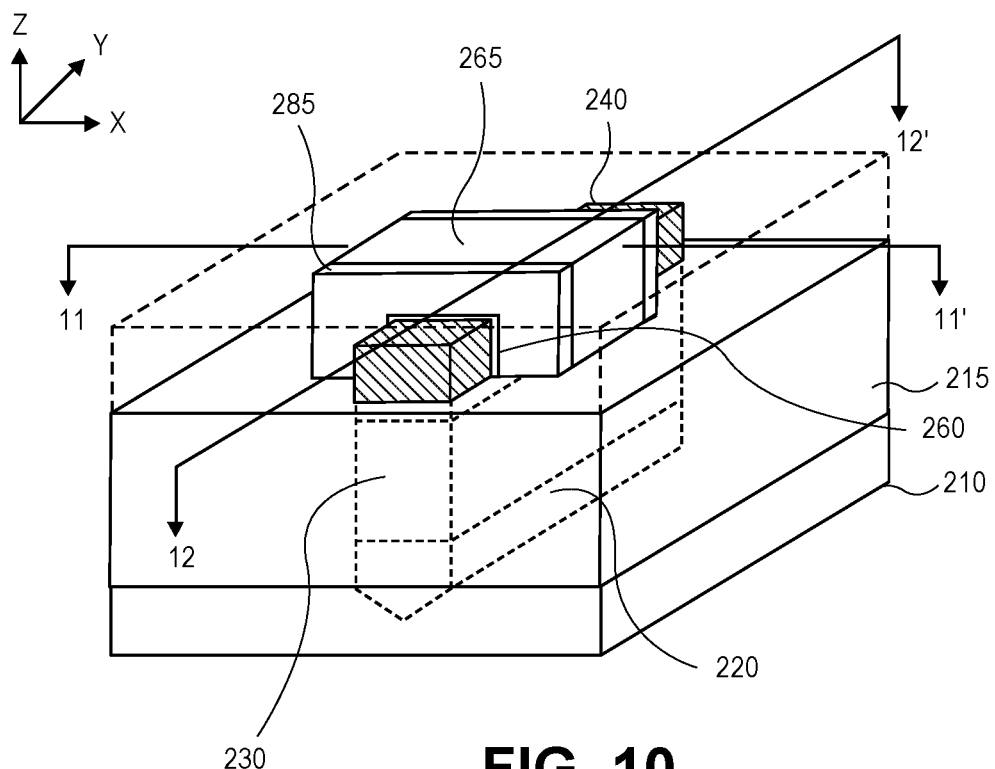
FIG. 10 shows a top side perspective view of the structure of FIG. 9 following the formation of a sacrificial or dummy gate stack on a fin portion of an intrinsic layer.

FIG. 10 shows the structure of FIG. 8 following the formation of a sacrificial or dummy gate stack on fin structure of the layer of semiconductor material 240 extending above dielectric layer 215 (block 340, FIG. 14). In one embodiment, a gate stack includes gate dielectric layer 260 of, for example, silicon dioxide or a high k dielectric material. Disposed on gate dielectric layer 260, in one embodiment, is dummy gate 265 of, for example, polysilicon deposited by, for example, a chemical vapor deposition method. In one embodiment, prior to forming the gate stack, a dielectric layer of silicon dioxide or a low k material is introduced on the structure (shown in dashed lines). To form the gate stack, a mask material is introduced over the structure on the dielectric layer and patterned to have an opening for the gate stack. The gate stack is then introduced in the opening. The gate stack may include a spacer dielectric layer defining spacers 285 on opposite sides thereof.

Figure 11:
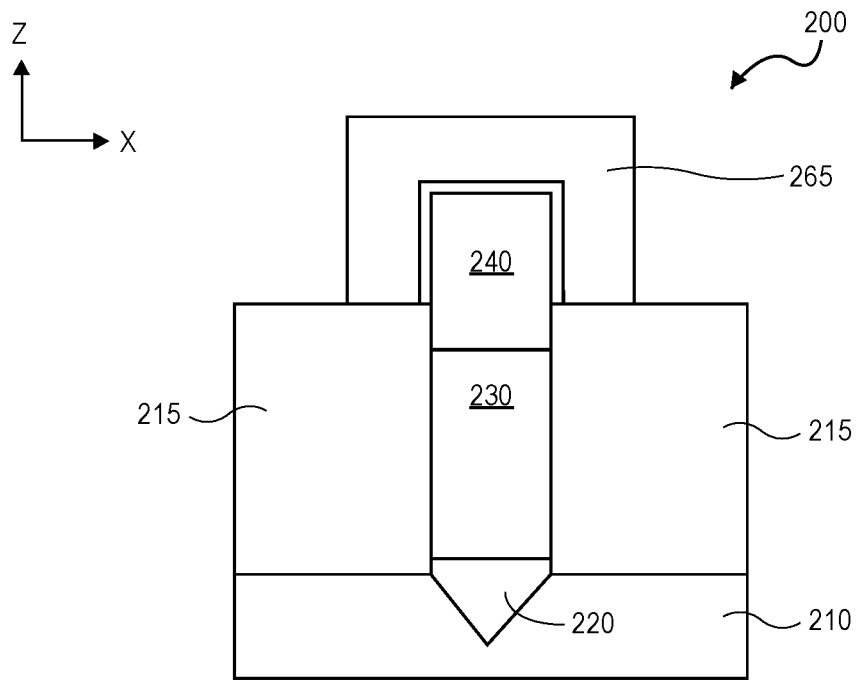
FIG. 11 shows the structure of FIG. 10 through line 11-11' showing the gate stack of the gate dielectric and dummy gate on the fin defined by the intrinsic layer.
Figure 12:
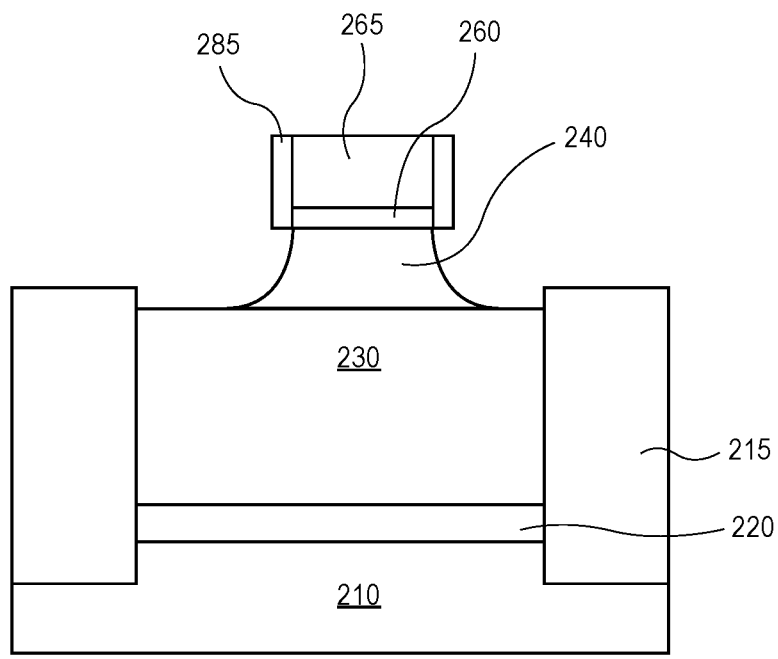
FIG. 12 shows a view of FIG. 10 through line 12-12' after removing portions of the intrinsic layer corresponding to source and drain regions in the fin.

FIG. 11 shows the structure of FIG. 10 through line 11-11' showing the gate stack of gate dielectric 260 and dummy gate 265 on the fin defined by semiconductor material 240. FIG. 12 shows a view of FIG. 10 through line 12-12' after removing portions of the fin of semiconductor material 240 corresponding to junction regions (source and drain) in the fin. Representatively, areas of the fin corresponding to the junction regions of the fin are exposed in the dielectric layer and an etch of the exposed areas is performed (an etch under-cut (EUC)) to remove semiconductor material 240 leaving voids (block 350, FIG. 14).

FIG. 13 shows the structure of FIG. 12 following the formation of a source and a drain of the device (block 370, FIG. 14). Source 250 and drain 255, in one embodiment, are a doped germanium material suitable for an PMOSFET. An example includes boron-doped germanium. In one embodiment, a material for source 250 and drain 255 is epitaxial grown.

Following formation of source 250 and drain 255, a dielectric material is introduced on the structure (on a surface including junction regions and sacrificial gate 265). In one embodiment, the dielectric material is silicon dioxide or a low k material or a combination of materials (e.g., multiple low k materials or silicon dioxide and one or more low k materials). FIG. 13 shows dielectric material 245 in dashed lines. Sacrificial gate 265 and gate dielectric are then removed and replaced with gate dielectric 268 of silicon dioxide, a high-k material or a combination of silicon dioxide and a high-k material. This is followed by the introduction of gate electrode 270 such as a metal gate electrode (block 380, FIG. 14). This is a typical gate-last process flow. Representative materials for a metal gate electrode include tungsten, tantalum, titanium or a nitride, a metal allow or another material. Following formation of gate electrode 270, contacts may be made to source 240 and drain 250 (and gate electrode 270) to form the device shown in FIG. 1 and FIG. 2 (block 390, FIG. 14).

Figure 15:
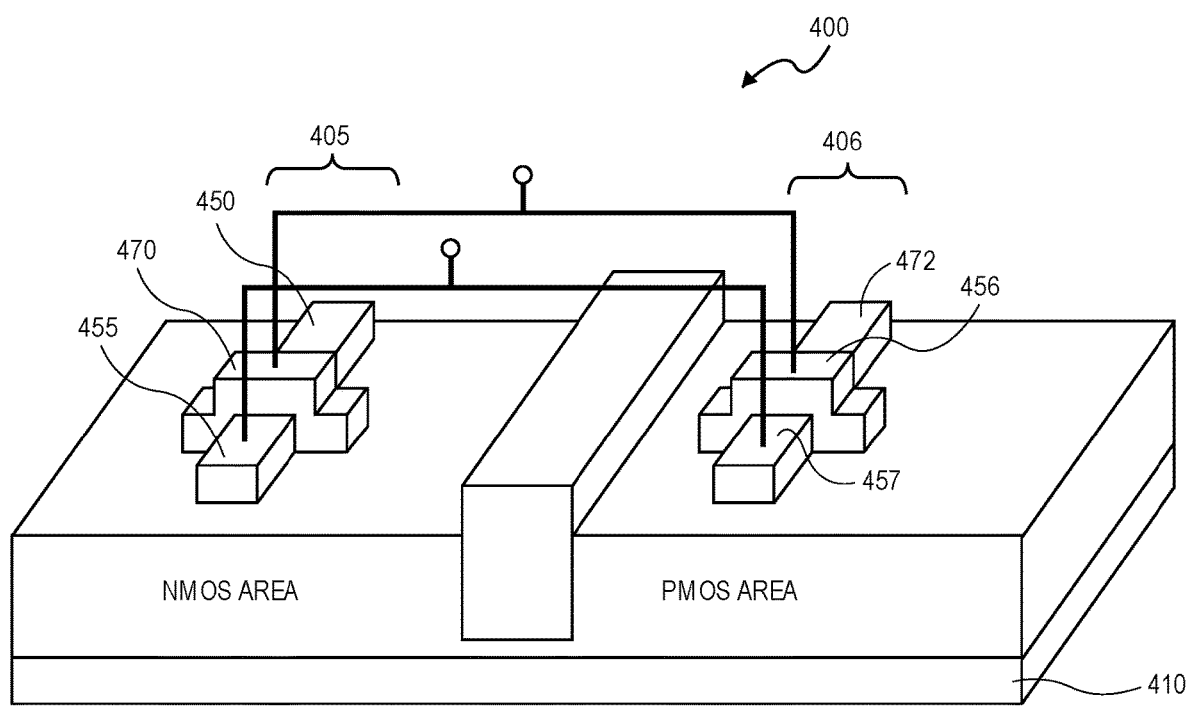
FIG. 15 shows a top side perspective schematic view of an embodiment of a CMOS inverter.

FIG. 15 shows a top, side perspective view of a CMOS inverter. Inverter 400 includes, in this embodiment, n-channel MOSFET 405 and p-channel MOSFET 406. Each of n-channel MOSFET 405 and p-channel MOSFET 406 is, in this embodiment, a non-planar device. It is appreciated that an inverter could also be formed using non-planar (e.g., multigate, nanowire) devices or a combination of different device types. In the embodiment illustrated in FIG. 14, each of n-channel MOSFET 405 and p-channel MOSFET 406 is formed on substrate 410. Substrate 410 is, for example, a single crystal silicon substrate or a silicon on insulator (SOI) substrate. N-channel MOSFET 405 and p-channel MOSFET 406 are separated by shallow trench isolation (STI) structure 450 of, for example, a dielectric material such as an oxide denoting in this illustration an NMOS area and a PMOS area. In PMOS area, p-channel MOSFET 406 is a device such as described above with reference to FIGS. 1-14 is formed. Formed in the PMOS area is p-channel MOSFET 406 that includes gate electrode 456 and appropriately doped (e.g., silicon-doped) source 472 and drain 457. Gate electrode 456 is disposed on a channel region of the transistor that is formed on semiconductor material of, for example, germanium. Gate electrode 456 is separated from the channel by a gate dielectric disposed therebetween of, for example, silicon dioxide or a high-k dielectric material or a combination of the two.

In NMOS area, p-channel MOSFET 406 in one embodiment is formed separately than n-channel MOSFET 405. Formed in NMOS area is n-channel MOSFET 405 that includes gate electrode 470 and source 450 and drain 455 appropriately doped or constituting n-type material. Gate electrode 470 is disposed on a channel of the transistor. Gate electrode 470 is separated from the channel by a gate dielectric such as silicon dioxide or a high-k dielectric material or a combination of the two. CMOS inverter 400 is formed by the connection of drain 455 of n-channel MOSFET 405 to drain 457 of p-channel MOSFET 406 and the connection of each gate electrode as illustrated.

FIG. 15 illustrates interposer 500 that includes one or more embodiments. Interposer 500 is an intervening substrate used to bridge a first substrate 502 to second substrate 504. First substrate 502 may be, for instance, an integrated circuit die. Second substrate 504 may be, for instance, a memory module, a computer motherboard, or another integrated circuit die. Generally, the purpose of interposer 500 is to spread a connection to a wider pitch or to reroute a connection to a different connection. For example, interposer 500 may connect an integrated circuit die to a ball grid array (BGA) 506 that can subsequently be coupled to the second substrate 504. In some embodiments, the first and second substrates 502/504 are attached to opposing sides of interposer 500. In other embodiments, first and second substrates 502/504 are attached to the same side of interposer 500. In further embodiments, three or more substrates are interconnected by way of interposer 500.

Interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

Interposer 500 may include metal interconnects 508 and vias 510, including but not limited to through-silicon vias (TSVs) 512. Interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 500.

In accordance with embodiments, apparatuses or processes disclosed herein may be used in the fabrication of interposer 500.

Figure 16:
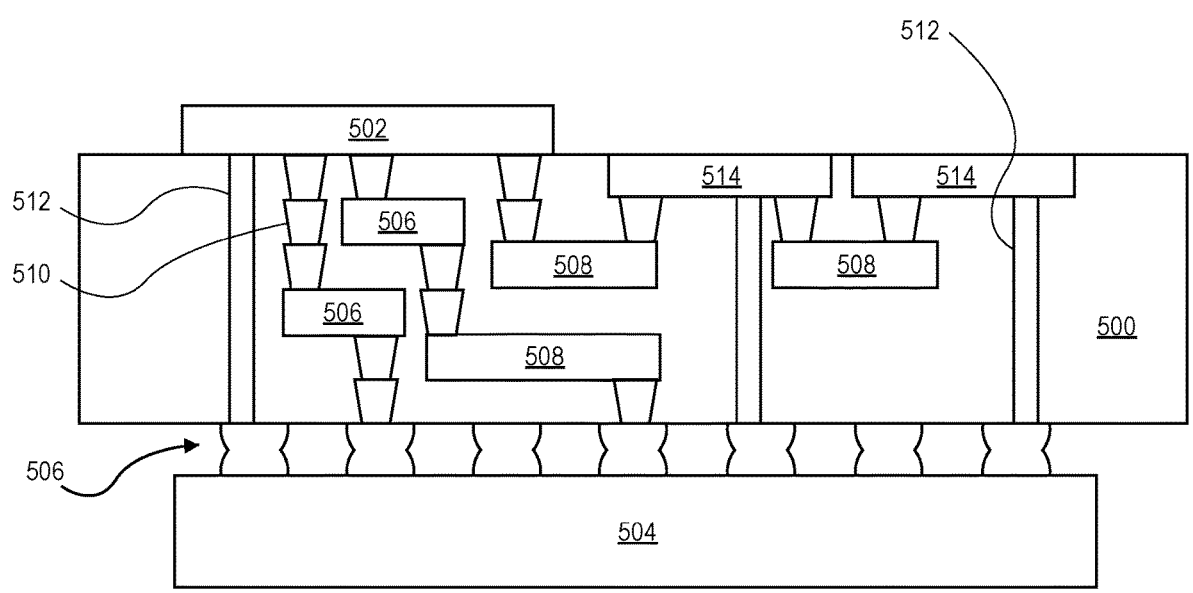
FIG. 16 is an interposer implementing one or more embodiments.
Figure 17:
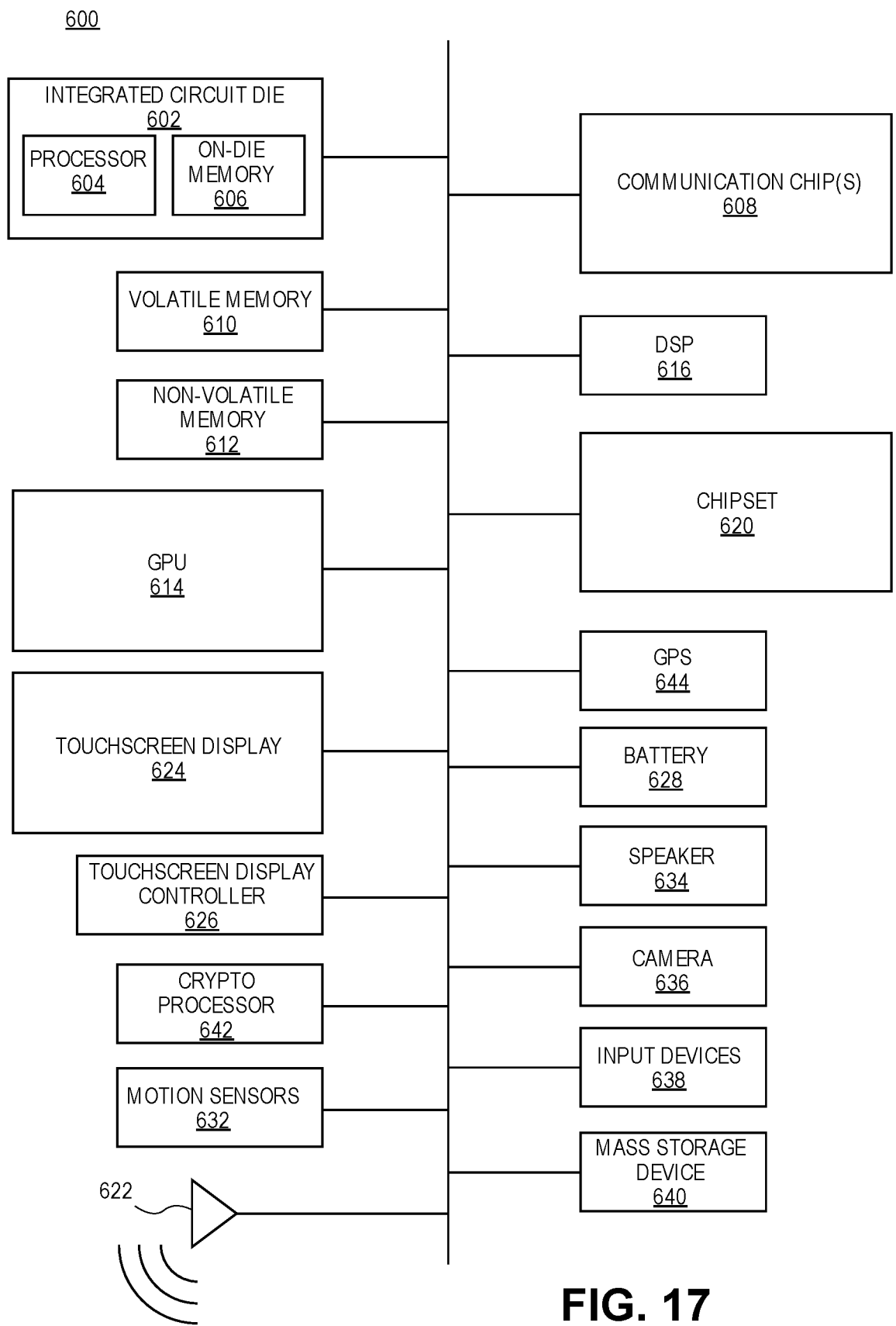
FIG. 17 illustrates an embodiment of a computing device.

FIG. 16 illustrates computing device 600 in accordance with one embodiment. Computing device 600 may include a number of components. In one embodiment, these components are attached to one or more motherboards. In an alternate embodiment, these components are fabricated onto a single system-on-a-chip (SoC) die rather than a motherboard. The components in computing device 600 include, but are not limited to, integrated circuit die 602 and at least one communication chip 608. In some implementations communication chip 608 is fabricated as part of integrated circuit die 602. Integrated circuit die 602 may include a central processing unit (CPU) 604 as well as on-die memory 606, often used as cache memory, that can be provided by technologies such as embedded DRAM (eDRAM) or spin-transfer torque memory (STTM or STTM-RAM).

Computing device 600 may include other components that may or may not be physically and electrically coupled to the motherboard or fabricated within an SoC die. These other components include, but are not limited to, volatile memory 610 (e.g., DRAM), non-volatile memory 612 (e.g., ROM or flash memory), graphics processing unit (GPU) 614, digital signal processor 616, crypto processor 642 (a specialized processor that executes cryptographic algorithms within hardware), chipset 620, antenna 622, display or touchscreen display 624, touchscreen controller 626, battery 628 or other power source, a power amplifier (not shown), global positioning system (GPS) device 644, compass 630, motion coprocessor or sensors 632 (that may include an accelerometer, a gyroscope, and a compass), speaker 634, camera 636, user input devices 638 (such as a keyboard, mouse, stylus, and touchpad), and mass storage device 640 (such as hard disk drive, compact disk (CD), digital versatile disk (DVD), and so forth).

Communications chip 608 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 608. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Processor 604 of computing device 600 includes one or more devices, such as transistors, that are formed in accordance with embodiments described above. The term "processor" may refer to any device or portion of a device that processes electronic data from registers and/or memory to transform that electronic data into other electronic data that may be stored in registers and/or memory.

Communication chip 608 may also include one or more devices, such as transistors, that are formed in accordance with embodiments.

In further embodiments, another component housed within computing device 600 may contain one or more devices, such as transistors, that are formed in accordance with implementations.

In various embodiments, computing device 600 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 600 may be any other electronic device that processes data.

EXAMPLES

The following examples pertain to embodiments:

Example 1 is a transistor device including a channel including a layer comprising germanium disposed over a substrate; a buffer layer disposed between the layer comprising germanium and the substrate, wherein the buffer layer includes silicon germanium; and a seed layer disposed between the buffer layer and the substrate, wherein the seed layer includes germanium.

In Example 2, the buffer layer of the apparatus of Example 1 is tensile strained.

In Example 3, the substrate of the apparatus of Example 1 includes silicon.

In Example 4, the seed layer of the apparatus of any of Examples 1-3 includes a thickness such that the germanium is fully relaxed.

In Example 5, the silicon germanium of the buffer layer of the apparatus of any of Examples 1-4 includes a similar lattice constant as a lattice constant of the germanium of the seed layer.

In Example 6, the silicon germanium of the buffer layer of the apparatus of Examples 1-5 includes a similar lattice constant as a lattice constant of the layer comprising germanium.

In Example 7, the transistor device of the apparatus of Example 1 includes a p-type transistor device.

In Example 8, the apparatus of any of Examples 1-7, wherein buffer layer comprises a defect-free surface at an interface with the channel.

Example 9 is a p-type transistor device including a layer including germanium disposed over a substrate; a buffer layer disposed between the layer comprising germanium and the substrate, wherein the buffer layer includes silicon germanium; and a seed layer disposed between the buffer layer and the substrate, wherein the seed layer includes germanium having a thickness greater than a critical thickness.

In Example 10, the buffer layer of the apparatus of Example 9 is tensile strained.

In Example 11, the substrate of the apparatus of Example 9 includes silicon.

In Example 12, the buffer layer of the apparatus of Example 9 includes a thickness that confines any defects due to a lattice mismatch of the seed layer and the substrate.

In Example 13, the buffer layer of the apparatus of Example 9 includes a defect-free surface at an interface with the channel.

In Example 14, the silicon germanium of the buffer layer of the apparatus of Example 9 includes a similar lattice constant as a lattice constant of the germanium of the seed layer.

In Example 15, the silicon germanium of the buffer layer of the apparatus of Example 9 includes a similar lattice constant as a lattice constant of the layer comprising germanium.

In Example 16, the transistor device of the apparatus of Example 9 includes a p-type transistor device.

Example 17 is a method including forming seed layer on a silicon substrate, wherein the seed layer includes germanium; forming a buffer layer on the seed layer, wherein the buffer layer includes silicon germanium; and forming a transistor device including a channel on the buffer layer.

In Example 18, the buffer layer in the method of Example 17 is tensile strained. In Example 19, forming the buffer layer in the method of Example 16 includes forming the layer to a thickness that confines any defects due to a lattice mismatch of the seed layer and the substrate.

In Example 20, forming the buffer layer in the method of any of Examples 17-19 includes forming the buffer layer with a defect-free surface at an interface with the channel.

In Example 21, forming the seed layer in the method of Examples 17-20 includes forming the layer to a thickness greater than a critical thickness of germanium.

In Example 22, the method of any of Examples 17-21, wherein forming a buffer layer includes forming a buffer layer having a thickness that is less than a critical thickness where the silicon germanium will adopt its natural lattice constant.

In Example 23, a transistor device made by the method of any of Examples 17-22. The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An transistor device comprising:
   a layer comprising germanium disposed over a substrate;
   a buffer layer disposed between the layer comprising germanium and the substrate, wherein the buffer layer comprises silicon germanium; and
   a seed layer disposed between the buffer layer and the substrate, wherein the seed layer comprises germanium, wherein the seed layer, the buffer layer, and the layer comprising germanium are within a trench in an insulation layer, the insulation layer having a top surface and a bottom surface, wherein an interface between the buffer layer and the layer comprising germanium is below the top surface of the insulation layer, wherein a top surface of the layer comprising germanium is above the top surface of the insulation layer, wherein a bottommost surface of the buffer layer is above the bottom surface of the insulation layer, wherein a bottom surface of the seed layer is below the bottom surface of the insulation layer, and wherein the bottom surface of the seed layer includes one or more facets that do not extend above the bottom surface of the insulation layer.

2. The transistor device of claim 1, wherein the buffer layer is tensile strained.

3. The transistor device of claim 1, wherein the substrate comprises silicon.

4. The transistor device of claim 1, wherein the seed layer comprises a thickness such that the germanium is fully relaxed.

5. The transistor device of claim 1, wherein the silicon germanium of the buffer layer comprises a similar lattice constant as a lattice constant of the germanium of the seed layer.

6. The transistor device of claim 1, wherein the silicon germanium of the buffer layer comprises a similar lattice constant as a lattice constant of the layer comprising germanium.

7. The transistor device of claim 1, wherein the transistor device comprises a p-type transistor device.

8. A p-type transistor device comprising:
   a layer comprising germanium disposed over a substrate;
   a buffer layer disposed between the layer comprising germanium and the substrate, wherein the buffer layer comprises silicon germanium; and
   a seed layer disposed between the buffer layer and the substrate, wherein the seed layer comprises germanium having a thickness greater than a critical thickness, wherein the seed layer, the buffer layer, and the layer comprising germanium are within a trench in an insulation layer, the insulation layer having a top surface and a bottom surface, wherein an interface between the buffer layer and the layer comprising germanium is below the top surface of the insulation layer, wherein a top surface of the layer comprising germanium is above the top surface of the insulation layer, wherein a bottommost surface of the buffer layer is above the bottom surface of the insulation layer, wherein a bottom surface of the seed layer is below the bottom surface of the insulation layer, and wherein the bottom surface of the seed layer includes one or more facets that do not extend above the bottom surface of the insulation layer.

9. The p-type transistor device of claim 8, wherein the buffer layer is tensile strained.

10. The p-type transistor device of claim 8, wherein the substrate comprises silicon.

11. The p-type transistor device of claim 8, wherein the buffer layer comprises a thickness that confines any defects due to a lattice mismatch of the seed layer and the substrate.

12. The p-type transistor device of claim 8, wherein the buffer layer comprises a defect-free surface at an interface with the channel.

13. The p-type transistor device of claim 8, wherein the silicon germanium of the buffer layer comprises a similar lattice constant as a lattice constant of the germanium of the seed layer.

14. The p-type transistor device of claim 8, wherein the silicon germanium of the buffer layer comprises a similar lattice constant as a lattice contact of the layer comprising germanium.

15. The p-type transistor device of claim 8, wherein the transistor device comprises a p-type transistor device.

* * * * *